United States Patent
Markman et al.

(10) Patent No.: US 9,391,741 B2
(45) Date of Patent: Jul. 12, 2016

(54) JOINT PREAMBLE AND CODE RATE IDENTIFIER IN A MOBILE DTV SYSTEM

(75) Inventors: Ivonete Markman, Carmel, IN (US); Richard W. Citta, Oak Park, IL (US)

(73) Assignee: Thomson Licensing, Issy les Moulineaux (FR)

( * ) Notice: Subject to any disclaimer, the term of this patent is extended or adjusted under 35 U.S.C. 154(b) by 946 days.

(21) Appl. No.: 13/505,330

(22) PCT Filed: Nov. 13, 2009

(86) PCT No.: PCT/US2009/006127
§ 371 (c)(1),
(2), (4) Date: May 1, 2012

(87) PCT Pub. No.: WO2011/059420
PCT Pub. Date: May 19, 2011

(65) Prior Publication Data
US 2012/0230437 A1    Sep. 13, 2012

(51) Int. Cl.
*H04N 7/26* (2006.01)
*H04L 1/00* (2006.01)
*H03M 13/47* (2006.01)
*H03M 13/00* (2006.01)
*H04L 27/02* (2006.01)
*H04L 27/26* (2006.01)
*H03M 13/29* (2006.01)

(52) U.S. Cl.
CPC ............ *H04L 1/0075* (2013.01); *H03M 13/47* (2013.01); *H03M 13/6306* (2013.01); *H04L 27/02* (2013.01); *H04L 27/2613* (2013.01); *H03M 13/296* (2013.01)

(58) Field of Classification Search
CPC ..................... H03M 13/2732; H03M 13/2906; H03M 13/2936; H03M 13/356; H03M 13/09; H04N 21/235; H04N 21/2383; H04N 21/4305; H04N 21/435; H04N 21/4382; H04L 1/0071; H04L 1/0065; H04L 1/0041; H04L 1/0045; H04L 1/0057; H04L 1/006
See application file for complete search history.

(56) References Cited

U.S. PATENT DOCUMENTS

| | | | |
|---|---|---|---|
| 5,265,105 A * | 11/1993 | Iwane | 375/365 |
| 7,369,633 B2 | 5/2008 | Jiang et al. | |
| 2003/0012287 A1 | 1/2003 | Katsavounidis et al. | |
| 2004/0252229 A1 | 12/2004 | Jiang et al. | |
| 2007/0230460 A1 | 10/2007 | Jeong et al. | |
| 2007/0253502 A1* | 11/2007 | Park et al. | 375/265 |
| 2008/0175236 A1* | 7/2008 | Lee et al. | 370/389 |
| 2009/0003459 A1 | 1/2009 | Limberg | |
| 2009/0052520 A1* | 2/2009 | Park et al. | 375/240 |
| 2009/0103649 A1 | 4/2009 | Vare et al. | |

(Continued)

*Primary Examiner* — Jay Patel
*Assistant Examiner* — Neil Mikeska
(74) *Attorney, Agent, or Firm* — Brian J. Dorini; Jerome G. Shaefer; Ivonete Markman (57) ABSTRACT

A joint preamble and code rate identifier flag in a reserved portion of a data field synchronization segment in a digital television (DTV) data field identifies the presence of preamble training data in a forward error correction (FEC) encoded portion of the DTV data field. The identifier flag also indicates the code rate used for the data field. The data field synchronization segment is not FEC encoded, thereby allowing detection of the identifier flag without FEC decoding. The detection at a receiver of the identifier flag in a DTV data field allows receiver elements, such as an equalizer and a FEC decoder, to more readily obtain and utilize the preamble training data, thereby enhancing reception and/or simplifying receiver design.

14 Claims, 6 Drawing Sheets

(56) References Cited

U.S. PATENT DOCUMENTS

| | | | |
|---|---|---|---|
| 2009/0103657 A1* | 4/2009 | Park et al. | 375/340 |
| 2009/0110083 A1* | 4/2009 | Park et al. | 375/240.27 |
| 2009/0125940 A1 | 5/2009 | Kim et al. | |
| 2009/0147889 A1* | 6/2009 | Chang et al. | 375/341 |
| 2009/0262799 A1 | 10/2009 | Limberg | |
| 2009/0265751 A1 | 10/2009 | Limberg | |
| 2009/0285137 A1* | 11/2009 | Fujita et al. | 370/310 |
| 2010/0091838 A1* | 4/2010 | Choi | 375/240.01 |

* cited by examiner

JOINT PREAMBLE AND CODE RATE IDENTIFIER IN A MOBILE DTV SYSTEM

This application claims the benefit, under 35 U.S.C. §365 of International Application PCT/US2009/006127, filed Nov. 13, 2009, which was published in accordance with PCT Article 21(2) on May 19, 2011 in English.

FIELD OF INVENTION

The present invention generally relates to digital television (DTV) systems and methods, and more particularly to mobile DTV systems and methods.

BACKGROUND

Figure 1:
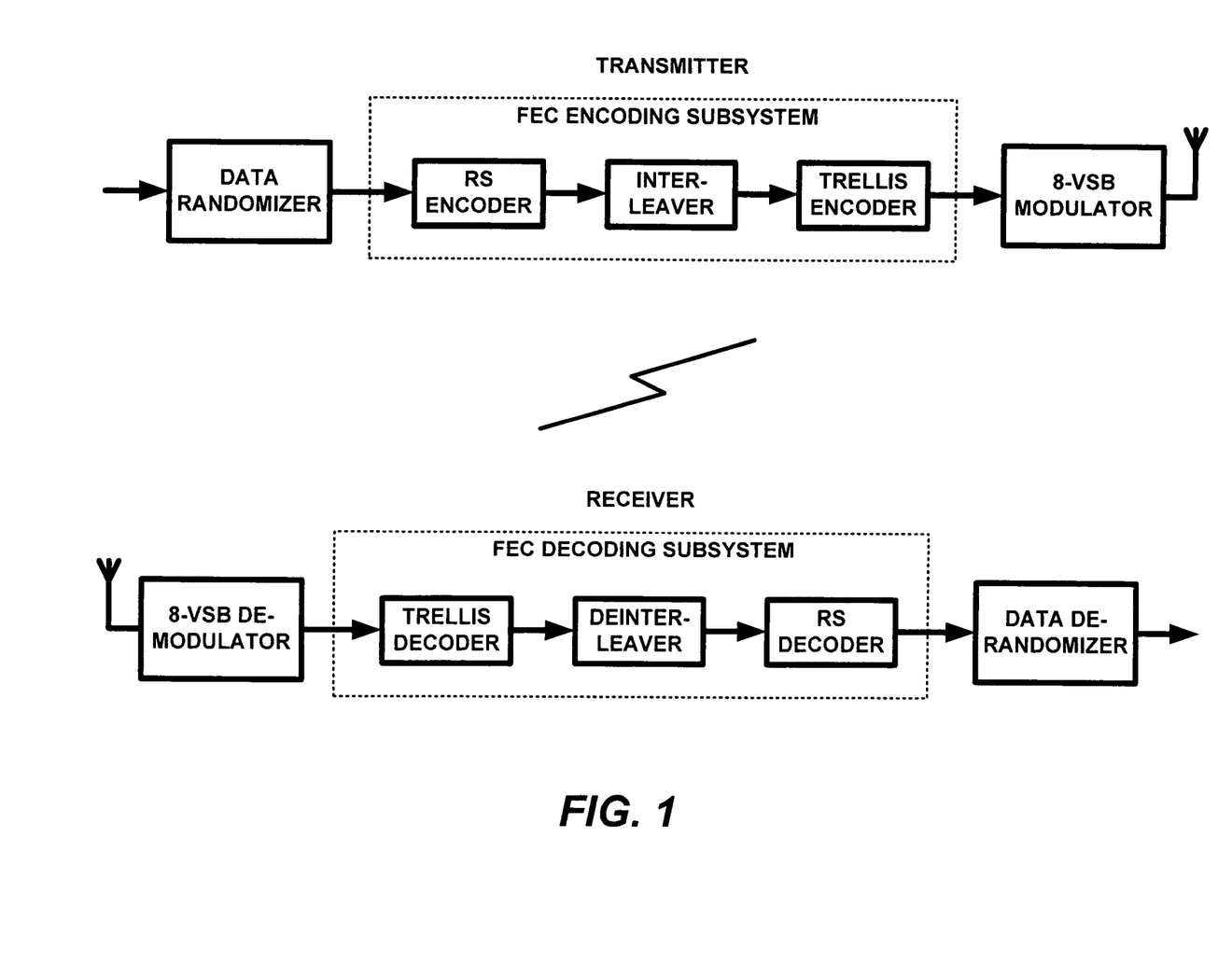
FIG. 1 is a block diagram of a digital television (DTV) system in accordance with the Advanced Television Systems Committee (ATSC) standard for DTV.

The Advanced Television Systems Committee (ATSC) standard for Digital Television (DTV) in the United States requires an 8-VSB transmission system which includes Forward Error Correction (FEC) as a means of improving system performance. (United States Advanced Television Systems Committee, "ATSC Digital Television Standard", (document A53.doc), Sep. 16, 1995.) FIG. 1 shows a simplified block diagram of a typical ATSC compliant DTV transmitter and receiver, emphasizing the FEC subsystem. As shown in FIG. 1, on the transmitter side, the FEC encoding subsystem includes a Reed-Solomon (RS) encoder, followed by a byte interleaver, and a trellis encoder. The FEC encoding subsystem is preceded by a data randomizer and followed by an 8-VSB modulator. On the receiver side, there is a corresponding FEC decoding subsystem which includes a trellis decoder, a byte de-interleaver and a RS decoder. The FEC decoding subsystem is preceded by an 8-VSB demodulator and followed by a data de-randomizer.

The ATSC DTV transmission scheme is not robust enough against Doppler shift and multipath radio interference, and is designed for highly directional fixed antennas, hindering the provision of expanded services to customers using mobile and handheld (M/H) devices. In an attempt to address these issues and to create a more robust and flexible system, it has been proposed, among other things, to add a new layer of FEC coding and more powerful decoding algorithms to decrease the Threshold of Visibility (TOV). (See, e.g., International Patent Publication No. WO 2008/144004 A1.) The added layer of FEC coding may require decoding techniques such as iterative (turbo) decoding (see, e.g., C. Berrou et al., "Near Shannon Limit Error—Correcting Coding and Decoding: Turbo-Codes (1)", Proceedings of the IEEE International Conference on Communications—ICC'93, May 23-26, 1993, Geneva, Switzerland, pp. 1064-1070; and M. R. Soleymani et al., "Turbo Coding for Satellite and Wireless Communications", Kluwer Academic Publishers, USA, 2002) and trellis decoding algorithms like the MAP decoder (see, e.g., L. R. Bahl et al., "Optimal Decoding of Linear Codes for Minimizing Symbol Error Rate", IEEE Transactions on Information Theory, Vol. IT-20, No. 2, March 1974, pp. 284-287.)

SUMMARY

In an exemplary embodiment in accordance with the principles of the invention, preamble training data conveying a priori tracking information for iterative forward error correction (FEC) decoding at a receiver, is included in a data field of a data burst that is transmitted to the receiver. The preamble training data may be fully encoded by all levels of FEC coding. A joint identifier flag placed in a reserved field of a data field synchronization segment of the data field indicates the presence of the preamble training data in the data field and conveys information regarding the FEC code rate. Preferably, the data field synchronization segment is not FEC encoded. Detection of the joint identifier flag allows the receiver to identify the presence of the preamble training data and to determine the FEC code rate prior to, or at an early iteration of FEC decoding. As a result, FEC decoding at the receiver is improved with lower overall latency.

In view of the above, and as will be apparent from the detailed description, other embodiments and features are also possible and fall within the principles of the invention.

BRIEF DESCRIPTION OF THE FIGURES

Some embodiments of apparatus and/or methods in accordance with embodiments of the present invention are now described, by way of example only, and with reference to the accompanying figures in which.

DESCRIPTION OF EMBODIMENTS

Other than the inventive concept, the elements shown in the figures are well known and will not be described in detail. For example, other than the inventive concept, familiarity with television broadcasting, receivers and video encoding is assumed and is not described in detail herein. For example, other than the inventive concept, familiarity with current and proposed recommendations for TV standards such as NTSC (National Television Systems Committee), PAL (Phase Alternation Lines), SECAM (SEquential Couleur Avec Memoire) and ATSC (Advanced Television Systems Committee) (ATSC), Chinese Digital Television System (GB) 20600-2006 and DVB-H is assumed. Likewise, other than the inventive concept, other transmission concepts such as eight-level vestigial sideband (8-VSB), Quadrature Amplitude Modulation (QAM), and receiver components such as a radio-frequency (RF) front-end (such as a low noise block, tuners, down converters, etc.), demodulators, interleavers, Reed-Solomon encoders/decoders, trellis encoders/decoders, FEC encoders/decoders, randomizers and derandomizers, equalizers, MAP decoders, Turbo decoders, correlators, leak integrators and squarers is assumed. Further, other than the inventive concept, familiarity with protocols such as Internet Protocol (IP), Real-time Transport Protocol (RTP), RTP Control Protocol (RTCP), User Datagram Protocol (UDP), is assumed and not described herein. Similarly, other than the inventive concept, familiarity with formatting and encoding methods such as Moving Picture Expert Group (MPEG)-2 Systems Standard (ISO/IEC 13818-1), H.264 Advanced Video Coding (AVC) and Scalable Video Coding (SVC) is assumed and not described herein. It should also be noted that the inventive concept may be implemented using various combinations of hardware and software which constitute a DTV receiver and processor. Finally, like-numbers on the figures represent similar elements.

Figure 2:
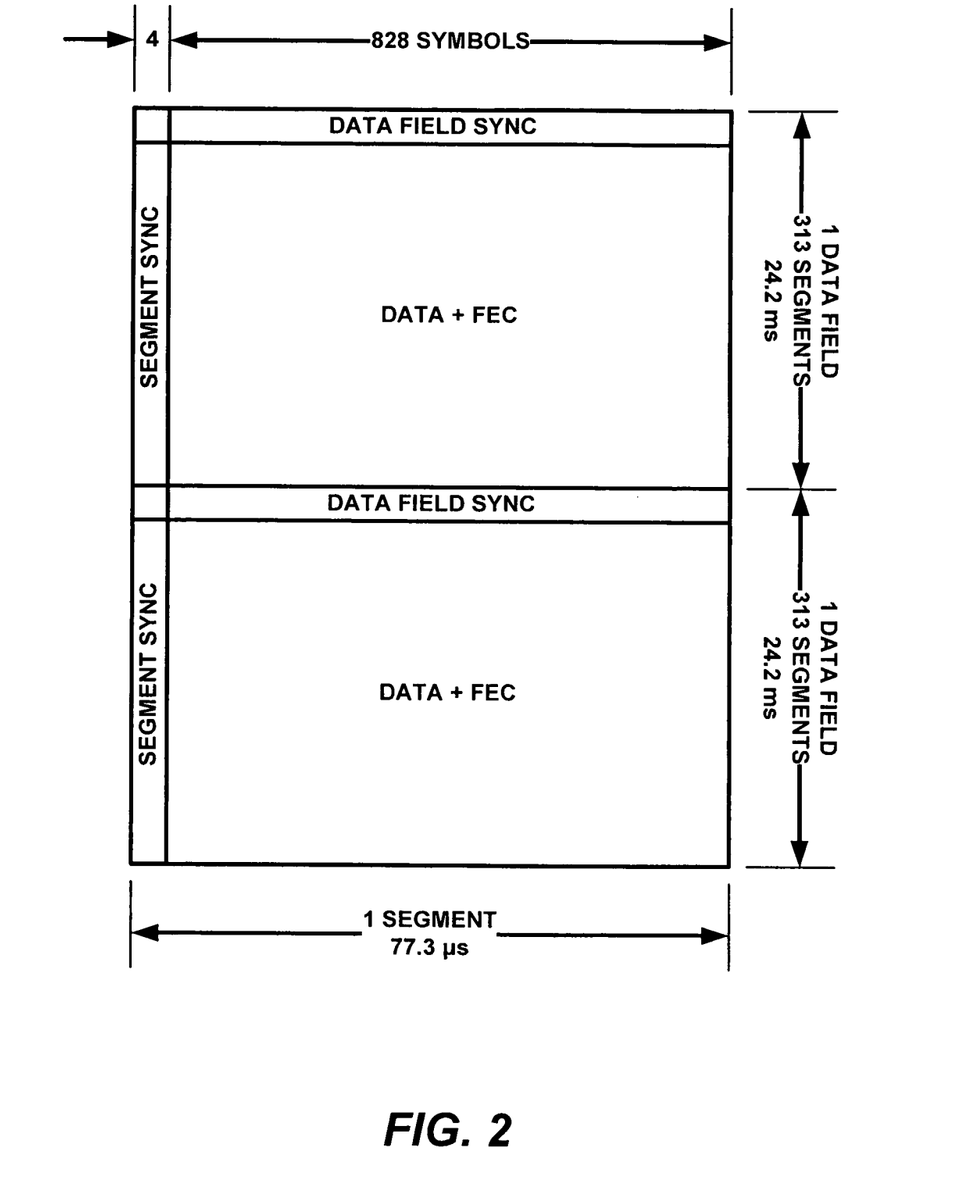
FIG. 2 illustrates the format of an ATSC-DTV data frame.

FIG. 2 shows the format of an ATSC-DTV data frame as transmitted. Each data frame consists of two data fields, each containing 313 segments. The first segment of each data field is a unique synchronization segment (Data Field Sync) shown in greater detail in FIG. 3 and further discussed below. Each of the remaining 312 segments of each data field, referred to as data segments, carries the equivalent data of one 188-byte MPEG-compatible transport packet and its associated FEC overhead. These segments are contained in the portions of the data fields of FIG. 2 labeled DATA+FEC. Note that while the 312 segments of each data field contain FEC encoded data, the Data Field Sync segment is not FEC encoded and thus need not be FEC decoded at the receiver.

Figure 3:
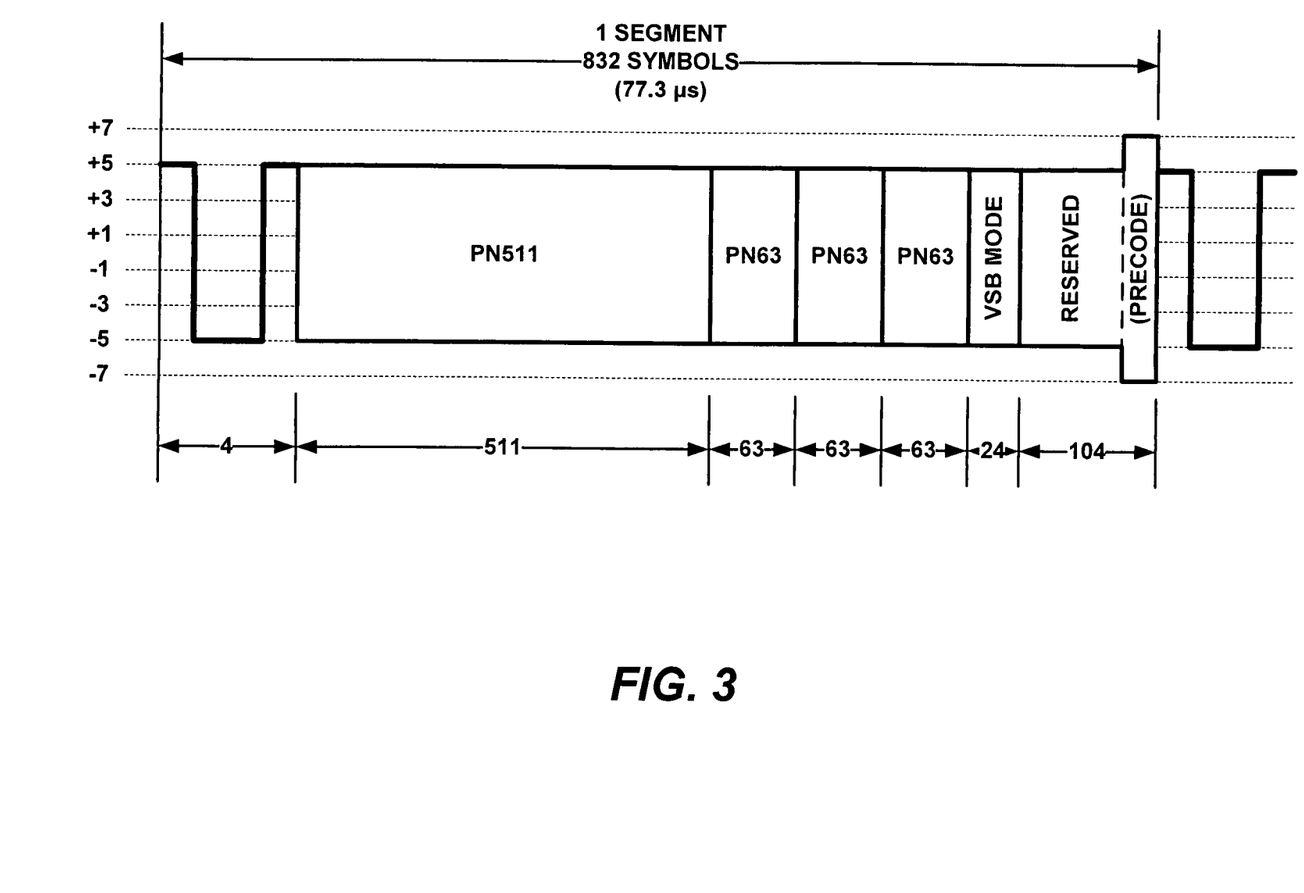
FIG. 3 illustrates the format of a Data Field Sync segment in an ATSC-DTV data frame.

Each segment consists of 832 8-VSB symbols. The first four symbols of each segment, including the Data Field Sync segments, form a binary pattern and provide segment synchronization. As shown in FIG. 3, which shows a Data Field Sync segment, the first four 8-VSB symbols of each data segment have values of +5, −5, −5, and +5. This four-symbol segment sync signal also represents the sync byte of each 188-byte MPEG-compatible transport packet conveyed by each of the 312 data segments in each data field. The remaining 828 symbols of each data segment carry data equivalent to the remaining 187 bytes of a transport packet and its associated FEC overhead.

As shown in FIG. 2, each segment takes 77.3 µs to transmit, thereby taking 48.4 ms to transmit one ATSC-DTV data frame.

As mentioned, FIG. 3 shows a Data Field Sync segment in greater detail. As shown in FIG. 3, each Data Field Sync segment starts with a four-symbol segment sync followed by several pseudo random or pseudo noise (PN) sequences, a VSB mode field and a reserved field of 104 symbols. (Note that the last 12 symbols of the reserved field, labeled PRE-CODE, are used in trellis coded terrestrial 8-VSB to replicate the last 12 symbols of the previous segment.) As described in greater detail below, an exemplary embodiment of the invention makes advantageous use of all or part of the reserved field of the Data Field Sync segment to provide improved reception and a simplified receiver design.

Figure 4:
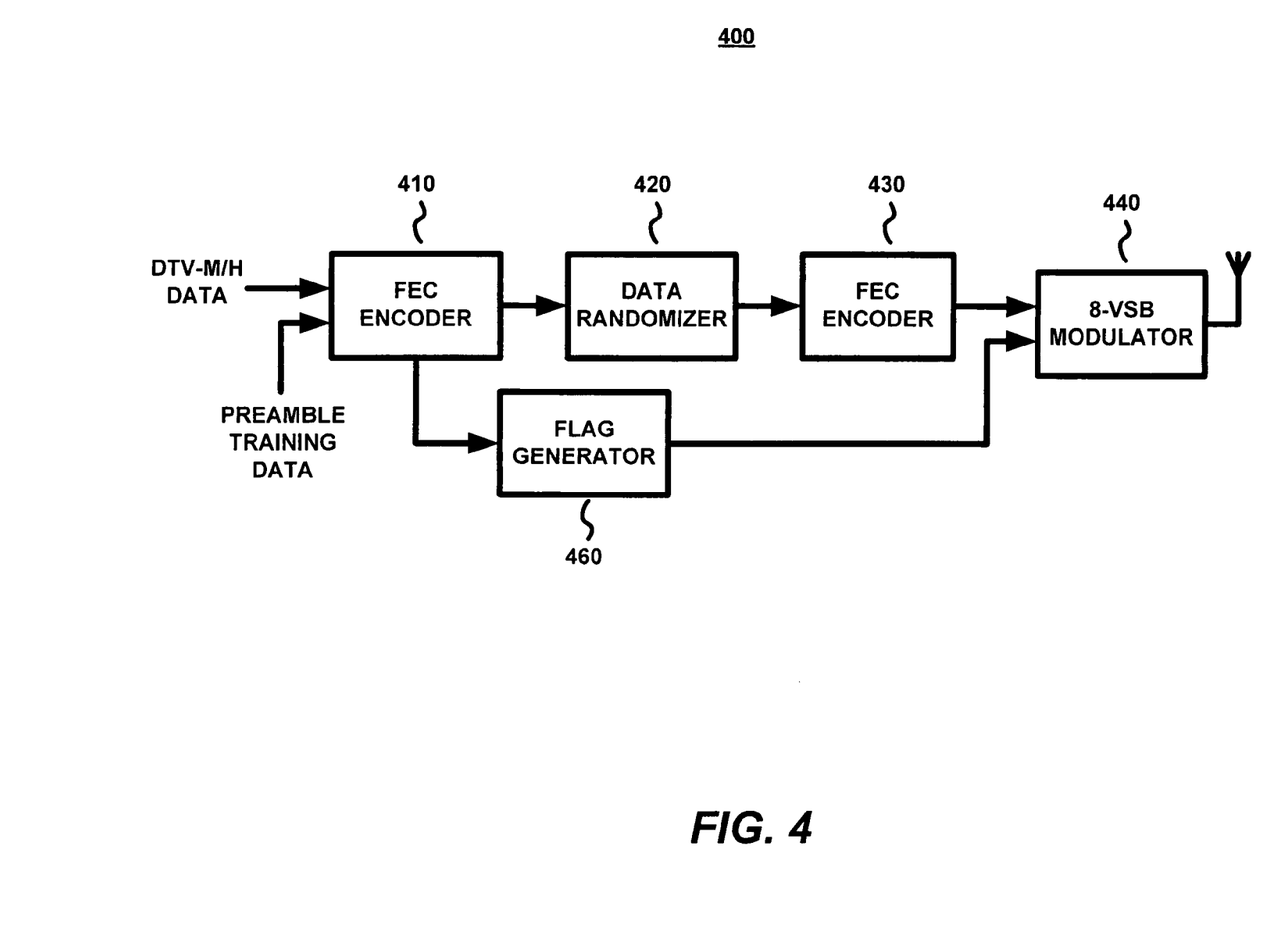
FIG. 4 is a block diagram of an exemplary embodiment of a transmitter in accordance with the principles of the invention.

FIG. 4 shows a block diagram of an exemplary transmitter 400 for a mobile/handheld (M/H) DTV system which employs two layers of FEC, as exemplified by FEC encoders 410 and 430 in the transmitter. FEC encoder 410 may implement multiple block and/or convolutional codes and include multiple block and/or convolutional interleavers. FEC encoder 430 corresponds to the FEC encoding subsystem in the transmitter of the ATSC DTV system of FIG. 1. Data randomizer 420, FEC encoder 430 and 8-VSB modulator 440 may be implemented as a conventional legacy ATSC DTV transmitter, such as shown in FIG. 1. The transmitter 400 also includes flag generator 460 which generates an identifier flag in accordance with information provided by FEC encoder 410 for insertion into the reserved field of a Data Field Sync segment, as described in greater detail below.

In an exemplary mobile DTV transmitter, such as shown in FIG. 4, preamble training data segments, also called a priori tracking (APT) packets, may be transmitted in addition to the synchronization data present in the ATSC-DTV data frame described above. For example, the training data may be transmitted in the DATA+FEC segments shown in FIG. 2. Placing the preamble training data in DATA+FEC segments, however, would subject the preamble training data to all levels of FEC coding and interleaving introduced by FEC encoder 430, as well as being randomized by data randomizer 420. In addition, preamble training data in the DATA+FEC segments may also be subjected to all levels of FEC coding and interleaving introduced by FEC encoder 410.

An example of a data burst, containing preamble training data, that can be used in an exemplary mobile DTV system is given in TABLE 1. The data burst of TABLE 1 will be referred to herein as a DTV-M/H (Mobile/Handheld) data burst.

TABLE 1

| DTV-M/H Data burst | |
|---|---|
| Data Field F0 | Data Field Sync segment |
| | 260 Legacy ATSC Data Segments |
| | 52 Preamble Data Segments |
| Data Field F1 | Data Field Sync segment |
| | 52 DTV-M/H Data Segments |
| | 26 Legacy ATSC Data Segments |
| | 104 DTV-M/H Data Segments |
| | 130 Legacy ATSC Data Segments |
| Data Field F2 | Data Field Sync segment |
| | 312 Legacy ATSC Data Segments |

As shown in TABLE 1, each DTV-M/H data burst includes three data fields, F0, F1 and F2. Each data field F0-F2 is analogous to a legacy ATSC-DTV data field, such as those shown in the legacy ATSC-DTV frame of FIG. 2. As such, each exemplary DTV-M/H data burst set forth in TABLE 1 corresponds to 1.5 frames of the legacy ATSC-DTV standard. Note that each data field F0-F2 starts with a Data Field Sync segment (such as shown in FIG. 3) followed by 312 FEC encoded data segments (as shown in FIG. 2). In typical operation, it is contemplated that a DTV-M/H receiving device will receive multiple legacy ATSC-DTV data fields or frames with one or more DTV-M/H data bursts in between.

In the exemplary DTV-M/H data burst of TABLE 1, preamble training data is contained in the first data field F0 as 52 data segments. When receiving an exemplary DTV-M/H data burst, a DTV-M/H receiver will discard the 260 Legacy ATSC data segments in Data Field F0 and process the remaining data including the 52 preamble training data segments. The preamble training data is to be utilized by a DTV-M/H receiver as training in order to enhance its performance. As described in greater detail below, signaling the presence of a preamble within a data field allows a simplified receiver design with improved performance.

Additionally in the exemplary DTV-M/H data burst of TABLE 1, DTV-M/H data segments are contained in the second data field F1 in a 52 segment block and a 104 segment block. In the exemplary transmitter 400 of FIG. 4, the 52 preamble training data segments in data field F0 and the 156 DTV-M/H data segments in data field F1 are provided to FEC encoder 410 for encoding and are fully FEC encoded by FEC encoder 410 as well as FEC encoder 430. FEC encoder 410 informs flag generator 460 of the FEC encoding of preamble training data as well as of the code rate used to FEC encode the DTV-M/H data segments and/or the preamble training data segments.

In an exemplary embodiment of the invention, a subset or the entirety of the reserved field (FIG. 3) of the Data Field Sync segment of one or more data fields F0-F1 of the DTV-M/H data burst of TABLE 1 contains an indicator to identify the presence or absence of preamble training data in the data field. In addition, this indicator also indicates the code rate used to FEC encode data contained in the data fields F0-F2 of the data burst. In an exemplary embodiment, the code rate indicated is that used by FEC encoder 410 in the transmitter of FIG. 4 to encode the DTV-M/H data and/or preamble training data segments contained in the data burst of TABLE 1. The indicator is referred to herein as a joint preamble and code rate identifier flag, or joint identifier flag, for short. In the exemplary transmitter 400 of FIG. 4, the joint identifier flag is generated by flag generator 460. The joint identifier flag may be a particular pattern, data sequence, or a PN sequence, which preferably can be readily regenerated by a field sync detector at a receiver. If a PN sequence is used, it could be a portion of the PN511 or the PN63 sequences already used in the Data Field Sync segment (FIG. 3) or a linear combination of these sequences. Because, as shown in TABLE 1, the preamble data signals the beginning of a burst of mobile data to the receiver, the use of such a flag in the Data Field Sync segment of Data Field F0 allows a receiver to identify the mobile data burst. This allows for improved reception and a simplified receiver design.

In an embodiment employing the exemplary DTV-M/H data burst structure of TABLE 1, the aforementioned joint identifier flag is placed in the Data Field Sync segment of data field F0. Further joint identifier flags with different values may be placed in the Data Field Sync segments of the other two data fields, F1 and F2, to indicate the lack of preamble training data in those fields. One skilled in the art will understand that there are multiple possible alternatives. In other embodiments, preamble training data for a data burst may be contained in one or more locations other than that shown in TABLE 1, including other data fields of the data burst.

In an exemplary embodiment of a mobile DTV system, four possible FEC code rates can be used: 2/3, 1/2, 1/4 and 1/8. Note that these are nominal code rates and that the actual code rates may differ. For example, the actual code rates may be 17/26, 12/26, 12/52 and 24/208, respectively (as in the M/H system described in International Patent Publication No. WO 2008/144004 A1.) TABLE 2 shows eight distinct modes (0-7) to be indicated by the aforementioned joint identifier flag for use in such a system.

TABLE 2

|  | Mode | | | | | | | |
| --- | --- | --- | --- | --- | --- | --- | --- | --- |
|  | 0 | 1 | 2 | 3 | 4 | 5 | 6 | 7 |
| Preamble | 0 (NO) | | | | 1 (YES) | | | |
| Code Rate | 2/3 | 1/2 | 1/4 | 1/8 | 2/3 | 1/2 | 1/4 | 1/8 |

TABLE 3 below shows three exemplary sets of flags (Flag Sets A, B and C) that can be used as joint preamble and code rate identifier flags to indicate the eight modes listed in TABLE 2. As shown in TABLE 3, each flag listed includes all or part of one or more PN sequences and/or modifications thereof. In TABLE 3, "partial" means that a segment of the particular PN sequence was used; "orthogonal", means that the orthogonal vector of the particular PN sequence segment was used, that is, (sPN')•(sPNorthogonal)=0, where sPN is the 8-VSB symbol version of the PN sequence (that is, a bit '1' in the PN sequence is transmitted as the 8-VSB symbol +5 and a bit '0', as the 8-VSB symbol −5), x' is the transpose of x, and "•" is the matrix product. In TABLE 3, the symbol "&" means that the flag is the concatenation of two PN segments, "time reverse" means that the time reverse of the PN segment was used, and "complement" means that the logical complement or inverse of the PN segment was used.

Note that the three exemplary Flag Sets set forth in TABLE 3 are only three of a multiplicity of possible sets that can be used. Observe that there are many other combinations of these elements and PN sequences that could result in distinct flags suitable for purposes of the invention. Additionally, while flags are shown for four different code rates, a lesser or greater number of code rates can be indicated with different flag sets than those shown in TABLE 3.

TABLE 3

| Mode | Flag Set A | Flag Set B | Flag Set C |
| --- | --- | --- | --- |
| 0 | PN63 | PN511 partial | PN63 partial & PN511 partial |
| 1 | PN63 orthogonal | PN511 partial orthogonal | PN63 partial orthogonal & PN511 partial orthogonal |
| 2 | PN63 time reverse | PN511 partial time reverse | PN63 partial time reverse & PN511 partial time reverse |
| 3 | PN63 orthogonal time reverse | PN511 partial orthogonal time reverse | PN63 partial orthogonal time reverse & PN511 partial orthogonal time reverse |
| 4 | PN63 complement | PN511 partial complement | PN63 partial complement & PN511 partial complement |
| 5 | PN63 complement orthogonal | PN511 partial complement orthogonal | PN63 partial complement orthogonal & PN511 partial complement orthogonal |
| 6 | PN63 complement time reverse | PN511 partial complement time reverse | PN63 partial complement time reverse & PN511 partial complement time reverse |
| 7 | PN63 complement orthogonal time reverse | PN511 partial complement orthogonal time reverse | PN63 partial complement orthogonal time reverse & PN511 partial complement orthogonal time reverse |

At the receiver, using correlation techniques or the like, the joint identifier flag can be detected independently or in conjunction with the detection of the Data Field Sync segment in which is it contained. Exemplary embodiments of receivers for each case are described below in greater detail with reference to FIGS. 5A and 5B, respectively. The information conveyed by the joint identifier flag (i.e., the reception of a DTV-M/H data burst, the expected reception of preamble training data, and the FEC code rate) can be provided to the equalizer and FEC portions of the receiver which can thus identify the presence of the preamble in the data and determine the FEC code rate in the quickest way possible, thereby enhancing their performance and simplifying the FEC decoding hardware design.

Figure 5A:
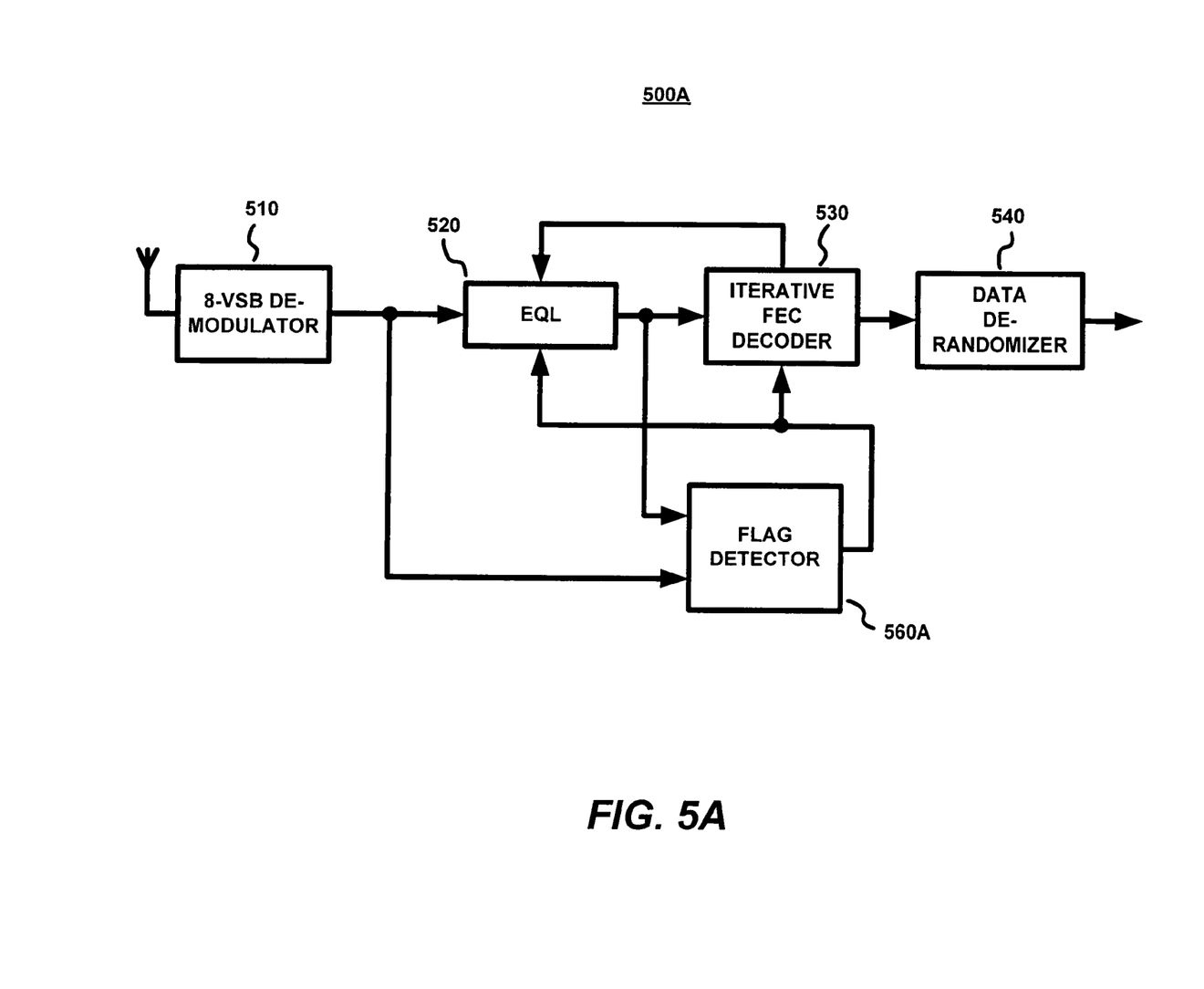
FIGS. 5A and 5B are block diagrams of exemplary embodiments of a receiver in accordance with the principles of the invention.

FIG. 5A is a block diagram of an exemplary embodiment of a DTV-M/H receiver 500A in accordance with the principles of the invention for operation with an exemplary transmitter, such as transmitter 400 of FIG. 4. The receiver 500A includes 8-VSB demodulator 510, equalizer 520, iterative FEC decoder 530 and data de-randomizer 540. 8-VSB demodulator 510, which can be implemented conventionally, demodulates the received signal which is then equalized by equalizer 520. The equalized signal is provided to iterative FEC decoder 530 which performs turbo decoding of the various FEC encoders within transmitter 400, including MAP decoding of the ATSC trellis encoding implemented by FEC encoder 430 and the additional FEC encoding implemented by FEC encoder 410. Iterative FEC decoder 530 will perform multiple decoding iterations, with the number of iterations depending on the desired performance. The decoded output of FEC decoder 530 is provided to data de-randomizer 540, which can be implemented conventionally. Equalizer 520 receives feed-back from iterative FEC decoder 530.

The receiver 500A also includes flag detector 560A which looks for the presence of a joint identifier flag in the received data stream at the output of demodulator 510 or equalizer 520. Using correlation techniques or the like, the flag detector 560A monitors the demodulated and/or equalized received data stream for a sequence of symbols matching one of the flags listed in TABLE 3. If such a sequence of symbols is detected, the flag detector 560A provides the preamble information corresponding to the detected flag to equalizer 520 and iterative FEC decoder 530, accordingly. Flag detector 560A provides the code rate information to iterative FEC decoder 530. Thus, for example, if Flag Set A of TABLE 3 is in effect and a PN63 complement time reverse sequence of symbols is detected, thereby indicating the reception of a Mode 6 joint identifier flag, equalizer 520 and FEC decoder 530 are thus informed, per TABLE 2, that the current data field contains preamble training data. Equalizer 520 and FEC decoder 530 can thus expect to start receiving the preamble training data a known number of segments (e.g., 260, per TABLE 1) following the Data Field Sync segment containing the preamble identifier flag. In addition, FEC decoder 530 is informed that the nominal code rate used to additionally FEC encode (e.g., by FEC encoder 410 in FIG. 4) the preamble training data segments and the DTV-M/H data segments to be received in the current data burst is 1/4. Upon reception of the preamble, equalizer 520 and FEC decoder 530 can use the training data in the preamble to process the received encoded data. Equalizer 520 uses the preamble training data to perform equalization of the demodulated signal at the output of demodulator 510, and FEC decoder 530 uses the preamble training data to perform iterative FEC decoding of the equalized signal at the output of equalizer 520. Data de-randomizer 540 de-randomizes the decoded data and can be implemented conventionally.

By contrast, because the preamble training data is FEC encoded, a conventional receiver would need to iteratively FEC decode the received data stream by multiple iterations before it can reliably detect the preamble training data and feed back the a priori information contained therein to the equalizer and/or other iterations of the FEC decoder. In addition, the FEC decoder would need to identify the code rate by trial and error. By utilizing a joint identifier flag of the present invention, which is not FEC encoded, as described above, the exemplary receiver 500A can identify the presence of the preamble training data and determine the code rate prior to FEC decoding. Moreover, detection of the joint identifier flag can be implemented more simply than detection of the preamble data itself As such, replacement of a preamble data detector with flag detector 560A represents a net simplification. In addition, the feedback path from iterative decoder 530 to equalizer 520 can be shortened (i.e., feedback from an earlier iteration of decoder 530 can be used), resulting in lower overall latency and thus improved receiver performance. Also, if the code rate is known in advance, the latency of the FEC decoder is reduced because there is no need for a trial and error procedure to identify the code rate.

Figure 5B:
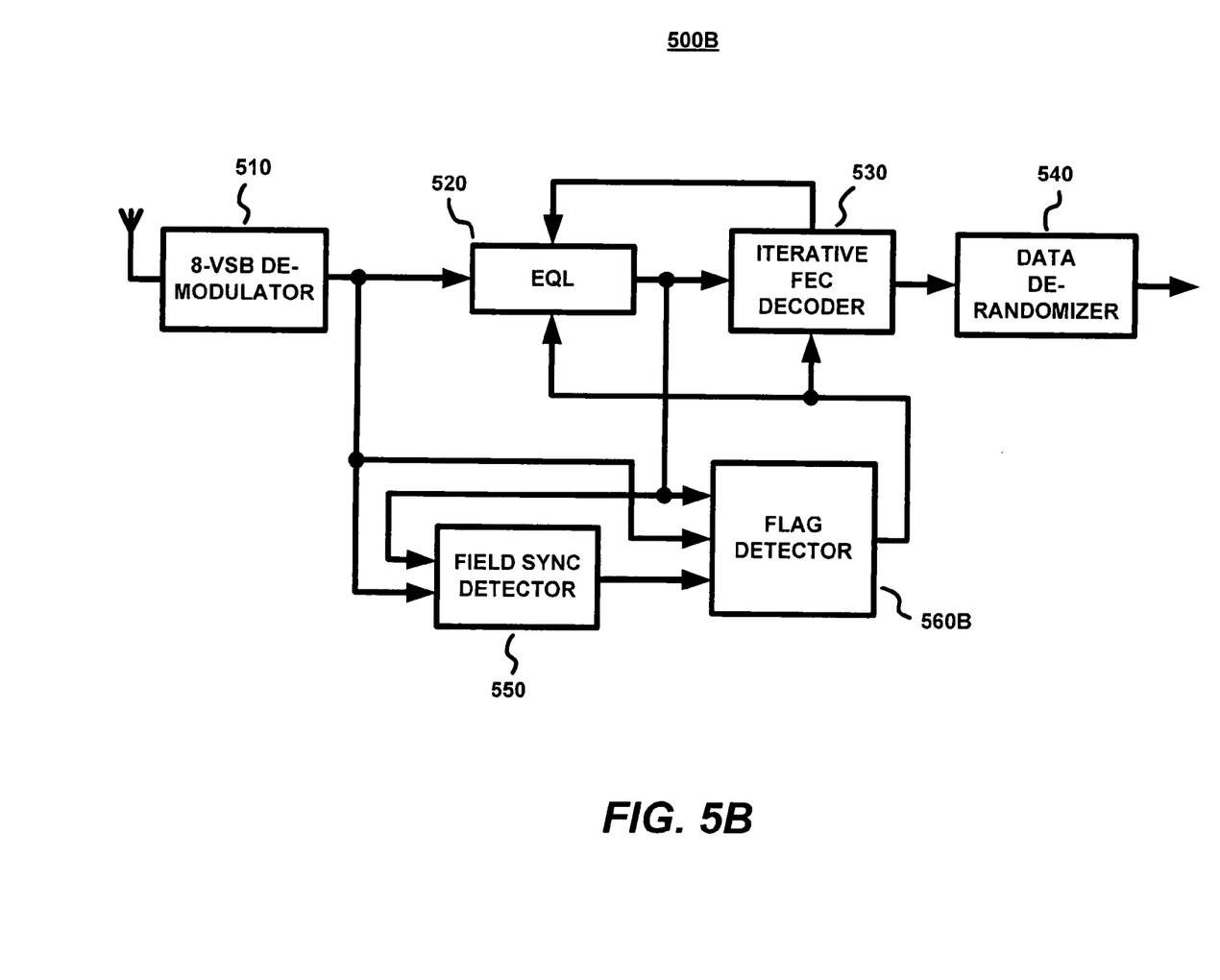

In a further embodiment of the invention shown in FIG. 5B, receiver 500B includes field sync detector 550 which looks for the presence of Data Field Sync segments in the data stream at the output of demodulator 510 or equalizer 520 using correlation or any other suitable method. In the embodiment of FIG. 5B, flag detector 560B receives an indication from field sync detector 550 of the presence of a Data Field Sync segment, thereby alerting flag detector 560B to search for the possible presence of a joint identifier flag in the reserved field of the Data Field Sync segment. It should be noted that a field sync detector, such as 550, will typically be included in any receiver designed to receive data bursts with Data Field Sync segments, such as shown in FIG. 3. Moreover, by using the indication provided by the field sync detector 550, it may be possible to simplify the implementation of flag detector 560B relative to that of flag detector 560A of the embodiment of FIG. 5A.

The joint preamble and code rate identifier flag detection as performed in the exemplary receivers of FIGS. 5A and 5B does not preclude other forms of preamble detection and code rate detection from being performed in the receiver as alternate solutions to enhance its performance. These distinct detection methods can provide feedback to each other in order to create a more reliable receiver.

The principles of this invention can be extended to other mobile DTV systems and data frame and preamble training structures.

In view of the above, the foregoing merely illustrates the principles of the invention and it will thus be appreciated that those skilled in the art will be able to devise numerous alternative arrangements which, although not explicitly described herein, embody the principles of the invention and are within its spirit and scope. For example, although illustrated in the context of separate functional elements, these functional elements may be embodied in one, or more, integrated circuits (ICs). Similarly, although shown as separate elements, some or all of the elements may be implemented in a stored-program-controlled processor, e.g., a digital signal processor or a general purpose processor, which executes associated software, e.g., corresponding to one, or more, steps, which software may be embodied in any of a variety of suitable storage media. Further, the principles of the invention are applicable to various types of wired and wireless communications systems, e.g., terrestrial broadcast, satellite, Wireless-Fidelity (Wi-Fi), cellular, etc. Indeed, the inventive concept is also applicable to stationary or mobile receivers. It is therefore to be understood that numerous modifications may be made to the illustrative embodiments and that other arrangements may be devised without departing from the spirit and scope of the present invention.

The invention claimed is:

1. A method performed by an apparatus to receive and process forward error correction (FEC) encoded video data in a mobile digital television (DTV) data burst, the method comprising:

detecting a joint identifier flag in a reserved portion of a data field of the data burst, wherein the joint identifier flag indicates whether the data field contains preamble training data and provides a code rate associated with data in the data burst, wherein said data burst contains a plurality of data fields, said reserved portion is not FEC encoded, and said preamble training data comprises a plurality of packets and is FEC encoded;

performing equalization of the FEC encoded video data by an equalizer using the preamble training data, said preamble training data being used to train the equalizer before processing of subsequent FEC encoded video data; and performing iterative FEC decoding of the FEC encoded video data by an iterative FEC decoder using the preamble training data and the code rate, said preamble training data being used to train the iterative FEC decoder before processing subsequent FEC encoded video data.

2. The method of claim 1, wherein at least one data field contains preamble training data.

3. The method of claim 1, wherein at least one data field does not contain preamble training data.

4. The method of claim 1, wherein the joint identifier flag includes a pseudo random sequence.

5. The method of claim 1, wherein the reserved portion of the data field of the data burst is contained in a data field synchronization segment of the data field.

6. The method of claim 5 comprising:
detecting the data field synchronization segment;
wherein detecting the joint identifier flag is performed in accordance with the detection of the data field synchronization segment.

7. An apparatus for receiving forward error correction (FEC) encoded video data in a mobile digital television (DTV) data burst, comprising:
a flag detector for detecting a joint identifier flag in a reserved portion of a data field of the data burst, wherein the joint identifier flag indicates whether the data field contains preamble training data and provides a code rate associated with data in the the data burst, wherein said data burst contains a plurality of data fields, said reserved portion is not FEC encoded, and said preamble training data comprises a plurality of packets and is FEC encoded;
an equalizer for performing equalization of the FEC encoded video data using the preamble training data, said preamble training data being used to train the equalizer before processing of subsequent FEC encoded video data; and
an iterative FEC decoder for performing iterative FEC decoding of the FEC encoded video data using the preamble training data and the code rate, said preamble training data being used to train the iterative FEC decoder before processing subsequent FEC encoded video data.

8. The apparatus of claim 7, wherein at least one data field contains preamble training data.

9. The apparatus of claim 7, wherein at least one data field does not contain preamble training data.

10. The apparatus of claim 7, wherein the joint identifier flag includes a pseudo random sequence.

11. The apparatus of claim 7, wherein the reserved portion of the data field of the data burst is contained in a data field synchronization segment of the data field.

12. The apparatus of claim 11 comprising:
a data field synchronization segment detector for detecting the data field synchronization segment;
wherein the flag detector detects the joint identifier flag in accordance with the detection of the data field synchronization segment.

13. A method performed by an apparatus to process and transmit forward error correction (FEC) encoded video data in a mobile digital television (DTV) data burst, the method comprising:
FEC encoding data with a code rate; and
transmitting a data burst containing the FEC encoded data, said data burst containing a plurality of data fields and at least one data field containing preamble training data, including:
generating a joint identifier flag, wherein the joint identifier flag provides a code rate and indicates that the at least one data field contains preamble training data; and
placing the joint identifier flag in a reserved portion of the data field, wherein said reserved portion is not FEC encoded and said preamble training data is FEC encoded, said preamble training data comprising a plurality of packets and being useful to train an equalizer and iterative FEC decoder in a receiver before processing of subsequent FEC encoded video data.

14. An apparatus for transmitting forward error correction (FEC) encoded video data in a mobile digital television (DTV) data burst, comprising:
a transmitter for transmitting a data burst containing the FEC encoded data, said data burst containing a plurality of data fields and at least one data field containing preamble training data, including:
a flag generator for generating a joint identifier flag and placing the joint identifier flag in a reserved portion of the data field, wherein the joint identifier flag provides a code rate and indicates that the at least one data field contains preamble training data, wherein said reserved portion is not FEC encoded and said preamble training data is FEC encoded, said preamble training data comprising a plurality of packets and being useful to train an equalizer and iterative FEC decoder in a receiver before processing of subsequent FEC encoded video data; and
an FEC encoder for FEC encoding data with a code rate.

* * * * *